(12) United States Patent
Wang et al.

(10) Patent No.: US 10,403,209 B2
(45) Date of Patent: Sep. 3, 2019

(54) ARRAY SUBSTRATE, ELECTRICAL AGING METHOD, DISPLAY DEVICE AND MANUFACTURING METHOD THEREOF

(71) Applicants: BOE Technology Group Co., Ltd., Beijing (CN); Ordos Yuansheng Optoelectronics Co., Ltd., Inner Mongolia (CN)

(72) Inventors: Jun Wang, Beijing (CN); Xinxin Jin, Beijing (CN); Yi Qu, Beijing (CN); Yi Zhang, Beijing (CN); Tianyi Cheng, Beijing (CN)

(73) Assignees: BOE Technology Group Co., Ltd., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 15/244,830

(22) Filed: Aug. 23, 2016

(65) Prior Publication Data

US 2017/0221421 A1   Aug. 3, 2017

(30) Foreign Application Priority Data

Jan. 28, 2016   (CN) .......................... 2016 1 0060551

(51) Int. Cl.
*G09G 3/3266* (2016.01)
*G09G 3/3291* (2016.01)
(Continued)

(52) U.S. Cl.
CPC ......... *G09G 3/3266* (2013.01); *G09G 3/3233* (2013.01); *G09G 3/3258* (2013.01);
(Continued)

(58) Field of Classification Search
CPC .. G09G 3/3266; G09G 3/3258; G09G 3/3233; G09G 3/006; G09G 3/3677;
(Continued)

(56) References Cited

U.S. PATENT DOCUMENTS 7,999,901 B2 *   8/2011   Kang .................... G02F 1/1345
                                                     345/104
8,174,280 B2 *   5/2012   Hung .................... G09G 3/006
                                                     324/537
(Continued)

FOREIGN PATENT DOCUMENTS

CN          1703119 A      11/2005
CN        101281738 A      10/2008
(Continued)

OTHER PUBLICATIONS

Oct. 10, 2017—(CN) Office Action application CN 201610060551.6 with English Translation.
(Continued)

*Primary Examiner* — Sardis F Azongha
(74) *Attorney, Agent, or Firm* — Banner & Witcoff, Ltd.

(57) ABSTRACT

An array substrate, an electrical aging method, a display device and a manufacturing method thereof. The array substrate includes: pixel circuits disposed in a display area, where each of the pixel circuits is disposed in a corresponding pixel region of the display area; a scanning drive circuit disposed outside the display area; a plurality of scanning-line groups for connecting the pixel circuits to the scanning drive circuit; a voltage input interface disposed outside the display area; and a wire group for connecting the plurality of scanning-line groups to the voltage input interface. An insulating layer is disposed between the wire group and the scanning drive circuit.

16 Claims, 2 Drawing Sheets

(51) Int. Cl.
  *G09G 3/3258* (2016.01)
  *H01L 27/32* (2006.01)
  *H01L 51/00* (2006.01)
  *G09G 3/3233* (2016.01)

(52) U.S. Cl.
  CPC ....... *G09G 3/3291* (2013.01); *H01L 27/3276* (2013.01); *H01L 51/0096* (2013.01); *G09G 2300/0809* (2013.01); *G09G 2300/0819* (2013.01); *G09G 2300/0842* (2013.01); *G09G 2300/0861* (2013.01); *G09G 2310/0202* (2013.01); *G09G 2310/0254* (2013.01); *G09G 2320/043* (2013.01); *G09G 2330/028* (2013.01); *G09G 2330/04* (2013.01); *H01L 2227/323* (2013.01); *H01L 2251/562* (2013.01)

(58) Field of Classification Search
  CPC ............. H01L 27/3276; H01L 27/3297; H01L 51/0096; F21V 23/001; F21V 23/004; G01R 31/02
  See application file for complete search history.

(56) References Cited

U.S. PATENT DOCUMENTS

| | | | | |
|---|---|---|---|---|
| 8,502,227 B2* | 8/2013 | Yoshida | ................ | G02F 1/1362 257/59 |
| 8,692,558 B2* | 4/2014 | Shen | ...................... | G09G 3/006 324/503 |
| 9,262,953 B2* | 2/2016 | Jeong | ..................... | G09G 3/006 |
| 9,287,295 B2* | 3/2016 | Lee | ........................ | H01L 27/124 |
| 9,356,087 B1* | 5/2016 | Lee | ........................ | H01L 27/3276 |
| 9,570,035 B2* | 2/2017 | Eom | ........................ | G09G 3/20 |
| 9,741,275 B2* | 8/2017 | Lv | ............................ | G09G 3/006 |
| 2005/0264180 A1 | 12/2005 | Kato | | |
| 2008/0169460 A1 | 7/2008 | Yoo | | |
| 2009/0040150 A1* | 2/2009 | Senda | .................. | G09G 3/3233 345/76 |
| 2009/0295699 A1 | 12/2009 | Korenari et al. | | |
| 2010/0014030 A1* | 1/2010 | Lin | ....................... | G02F 1/1345 349/84 |
| 2013/0088679 A1* | 4/2013 | Lu | .......................... | G09G 3/006 349/139 |
| 2016/0247430 A1* | 8/2016 | Cho | ........................ | G09G 3/006 |
| 2017/0302265 A1 | 10/2017 | Wang et al. | | |

FOREIGN PATENT DOCUMENTS

| | | |
|---|---|---|
| CN | 101405785 A | 4/2009 |
| CN | 101593758 A | 12/2009 |
| CN | 102237027 A | 11/2011 |
| CN | 104678272 A | 6/2015 |
| KR | 20060132361 A | 12/2006 |
| KR | 20080060880 A | 7/2008 |
| KR | 20080100016 A | 11/2008 |

OTHER PUBLICATIONS

May 16, 2018—(CN) Second Office Action Appn 201610060551.6 with English Translation.

* cited by examiner

ARRAY SUBSTRATE, ELECTRICAL AGING METHOD, DISPLAY DEVICE AND MANUFACTURING METHOD THEREOF

This application claims priority to and the benefit of Chinese Patent Application No. 201610060551.6 filed on Jan. 28, 2016, which application is incorporated herein in its entirety.

Embodiments of the present disclosure relate to an array substrate, an electrical aging method, a display device and a manufacturing method thereof.

BACKGROUND

Existing technologies have provided corresponding electrical aging methods for active-matrix organic light-emitting diode (AMOLED) display panels. Square-wave voltage signals with voltage values ±12v to ±20v can be applied to gate driver on array (GOA) circuits in an array substrate, resulting in indirectly applying aging voltages to gate electrodes of positive channel metal oxide semiconductor (PMOS) transistors in the pixel circuits. Combining with the application of −20V to −12V drain-source voltages to the PMOS transistors, the electrical aging of the PMOS transistors in pixel circuits can be performed, and therefore a purpose of reducing drain currents of transistors can be achieved. However, in the electrical aging method in the existing technologies, voltages with overlarge amplitude need to be directly applied to the GOA circuits, which may cause potential damages on the GOA circuits.

SUMMARY

Embodiments of the present disclosure provide an array substrate, which includes: pixel circuits disposed in a display area, where each of the pixel circuits is disposed in a corresponding pixel region of the display area; a scanning drive circuit disposed outside the display area; a plurality of scanning-line groups for connecting the pixel circuits to the scanning drive circuit; a voltage input interface disposed outside the display area; and a wire group for connecting the plurality of scanning-line groups to the voltage input interface. An insulating layer is disposed between the wire group and the scanning drive circuit.

Embodiments of the present disclosure also provide a display device, including the above array substrate.

Embodiments of the present disclosure also provide an electrical aging method of pixel circuits, with the pixel circuits being disposed in pixel regions of a display area of the array substrate. The electrical aging method includes: applying aging voltage signals to voltage input ports of the voltage input interface respectively, so that at least part of transistors in the pixel circuits are subjected to electrical aging in response to application of the aging voltage signals received by gate electrodes of the transistors.

Embodiments of the present disclosure also provide a method for manufacturing a display device, with the display device including the array substrate, the array substrate including a cut-off area disposed at the edge of the array substrate, and a wiring path of each wire in the wire group running through the cut-off area. The manufacturing method includes: removing the cut-off area to cut off each wire in the wire group after electrical aging of the pixel circuits on the array substrate.

BRIEF DESCRIPTION OF THE DRAWINGS

In order to illustrate the technical solutions in the embodiments of the present disclosure or the existing arts more clearly, the drawings need to be used in the description of the embodiments or the existing arts will be briefly described in the following; it is obvious that the drawings described below are only related to some embodiments of the present disclosure, for one ordinary skilled person in the art, other drawings can be obtained according to these drawings.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

The embodiments of the present disclosure provide an array substrate, an electrical aging method, a display device and a manufacturing method thereof, which can solve the problem that a conventional electrical aging method can damage the GOA circuits. For example, in the embodiments of the present disclosure, damage on the GOA circuits caused by the conventional electrical aging method can be avoided.

Figure 1:
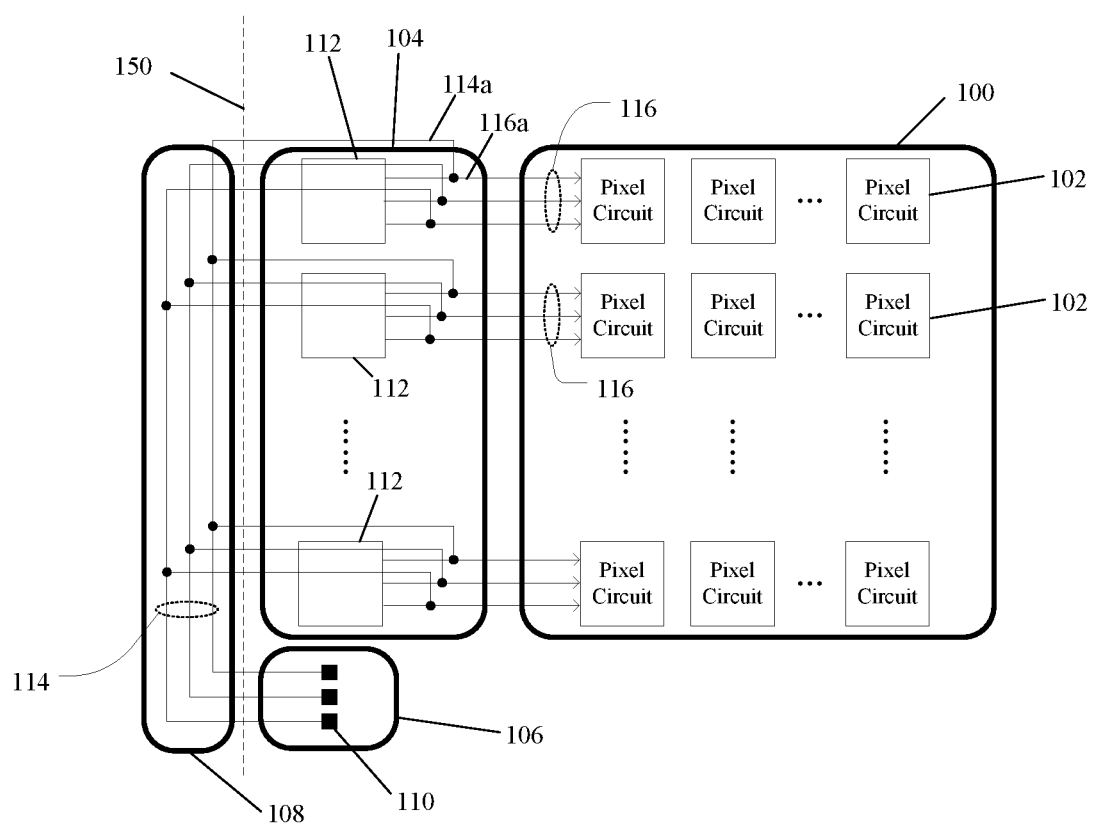
FIG. 1 is a schematic partial top view of a structure of an array substrate provided by one embodiment of the present disclosure.

FIG. 1 is a schematic partial top view of a structure of an array substrate provided by one embodiment of the present disclosure. As illustrated in FIG. 1, the array substrate comprises pixel circuits 102 disposed in respective pixel regions of a display area 100, a scanning drive circuit 104 disposed outside the display area 100, and a plurality of scanning-line groups 116 for connecting the pixel circuits 102 to the scanning drive circuit 104. For instance, each circuit unit 112 in the scanning drive circuit 104 is connected with respective pixel circuits in one row of pixel circuits 102 through one scanning-line group 116. A scanning-line group 116 may include one or more scanning lines (e.g., each scanning-line group 116 in FIG. 1 includes 3 scanning lines). The array substrate further comprises: a voltage input interface 106 disposed outside the display area 100, and a wire group 114 for connecting the plurality of scanning-line groups to the voltage input interface 106. For instance, the voltage input interface 106 includes one or more voltage input ports 110 (e.g., the voltage input interface 106 in FIG. 1 includes 3 voltage input ports 110). For instance, the number of the voltage input ports 100 in the voltage input interface 106, the number of wires in the wire group 114 and the number of scanning lines in each scanning-line group 116 are all equal to each other. An insulating layer IL is disposed between the wire group 114 and the scanning drive circuit 104 (not shown in FIG. 1).

It should be noted that the array substrate provided by embodiments of the present disclosure may be applied in any display device, and the display area 100 corresponds to an active area of the display device. In terms of a specific type, the pixel regions may be arranged in the display area 100 in any way, and a plurality of scanning lines extending in the row direction may be arranged correspondingly. Based on different display emission driving modes, the pixel circuits 102 can achieve corresponding functions through any circuit structures. According to different types and numbers of scanning drive signals needed by the pixel circuits 102, the scanning drive circuit 104 can provide corresponding scanning drive signals through any circuit structures. It should be noted that in the embodiments of the present disclosure, as the scanning drive circuit 104 is disposed on the array substrate, its functionality can be achieved by technologies such as a GOA.

For instance, the voltage input interface 106 may be referred to a structure disposed outside the display area 100 of the array substrate and configured to connect to external voltages, and the wire group 114 may be referred to a conductor structure with wires configured to connect the plurality of scanning-line groups to the voltage input interface 106 according to a predetermined corresponding relationship. The wire group may include one or more wires. For instance, the predetermined corresponding relationship indicates that a respective scanning line in each scanning-line group is connected to a corresponding voltage input port. As illustrated in FIG. 1, the pixel circuits 102 are arranged in the display area 100 in rows and columns, and each row of pixel circuits 102 are connected with one circuit unit 112 in the scanning drive circuit 104 through one scanning-line group (e.g., each scanning-line group including three scanning lines). It should be understood that when all the pixel circuits 102 have the same circuit structure, the operating states of pixel circuits 102 in each row are controlled by three different scanning drive signals. Thus, the predetermined corresponding relationship may be as shown in FIG. 1: respective scanning lines for transmitting the same type of scanning drive signals are respectively connected to an identical voltage input port through a wire, so that each of the three voltage input ports in the voltage input interface can correspond to one type of scanning drive signals. For instance, a first scanning line in each scanning-line group is connected to the same first wire, and subsequently, the first wire is connected to a first voltage input port, so that a first scanning drive signal can be inputted into the respective first scanning lines of all the scanning-line groups through the first voltage input port. Similarly, a second scanning line in each scanning-line group is connected to the same second wire, and subsequently, the second wire is connected to a second voltage input port, so that a second scanning drive signal can be inputted into the respective second scanning lines of all the scanning-line groups through the second voltage input port. A third scanning line in each scanning-line group is connected to a same third wire, and subsequently, the third wire is connected to a third voltage input port, so that a third scanning drive signal can be inputted into the respective third scanning lines of all the scanning-line group through the third voltage input port.

It should be noted that: on the basis of the predetermined corresponding relationship as shown in FIG. 1, identical voltage signals may be simultaneously inputted into all the pixel circuits 102 through the same voltage input interface. However, when different voltage signals are needed to be respectively inputted into different rows of pixel circuits 102, the predetermined corresponding relationship may include connecting scanning lines corresponding to different rows of pixel circuits 102 to different voltage input interfaces or different voltage input ports. No limitation is given here in the present disclosure.

Figure 3:
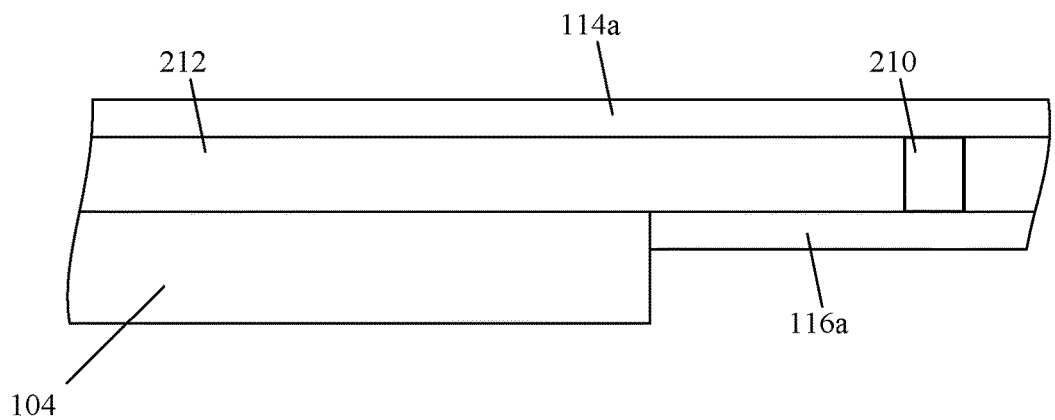
FIG. 3 illustrates an insulating layer disposed on a scanning drive circuit in one embodiment of the present disclosure.

In addition, the insulating layer IL is an insulating structure disposed between the wire group 114 and the scanning drive circuit 104 and is configured to isolate electrical signals between the wire group 114 and the scanning drive circuit 104. In an example, the insulating layer IL may be a passivation layer covering the scanning drive circuit 104, and the wire group is formed on the insulating layer IL in a configuration area of the scanning drive circuit 104. Through holes are formed in the insulating layer IL at positions where respective wires in the wire group 114 are connected to the corresponding scanning lines. For instance, FIG. 1 illustrates a scanning line 116a of a scanning-line group 116 and a wire 114a of the wire group 114; as illustrated in FIG. 3, the insulating layer IL (labeled with a reference number "212") is formed on the scanning drive circuit 104 and the scanning line 116a, and the wire 114a is formed on the insulating layer 212 and connected with the scanning line 116a via a through hole 210. In another example, both the wire group 114 and the scanning drive circuit 104 are directly formed on a substrate, and in this case, part of a gate insulating layer disposed between the wire group and the scanning drive circuit 104 can be used as the insulating layer IL. Of course, as long as the insulating layer IL is capable of avoiding severe circuit defects such as short circuit and signal interference between the wire group and the scanning drive circuit 104, the specific form of the insulating layer IL is not limited in the disclosure.

In a conventional array substrate not provided with the voltage input interface 106, the wire group 114 and the insulating layer IL, a conventional electrical aging method generally applies an input voltage higher than an operating voltage of the scanning drive circuit to the scanning drive circuit, and hence indirectly applies aging voltages to the pixel circuits by using the output voltages on the scanning lines of the scanning drive circuit. In this case, in one aspect the scanning drive circuit tends to be damaged under too high voltage input; and in another aspect the circuit defects in the scanning drive circuit may result in insufficient aging of the pixel circuits with too low aging voltages or the pixel circuits may be damaged under too high aging voltages.

In contrast, in the embodiments of the present disclosure, due to the arrangement of the wire group, the voltage input interface and the insulating layer, voltages can be directly applied to the plurality of scanning-line groups through the wire group and the voltage input interface; and meanwhile, the wire group running above the configuration area of the scanning drive circuit 104 may not cause damage to the scanning drive circuit 104 due to insulation from the insulating layer. In another aspect, as the aging voltages are directly applied to the plurality of scanning-line groups, the circuit defects in the scanning drive circuit 104 will not affect the electrical aging of the pixel circuits 102.

It can be seen that embodiments of the present disclosure can solve the problem that the conventional electrical aging method can damage the GOA circuits. Thus, embodiments of the present disclosure can reduce the yield loss caused by the damage of the GOA circuits during conventional electrical aging, and hence can improve the production efficiency and reduce the cost.

As illustrated in FIG. 1, the array substrate shown in FIG. 1 also includes a cut-off area 108 disposed at an edge of the array substrate, and a wiring path of each wire in the wire group runs through the cut-off area 108. It should be understood that the cut-off area is a special area disposed at the edge of the array substrate and is mainly configured to accommodate structures which are needed in some manufacturing, testing or repair processes but are not needed or adverse during display. Therefore, the cut-off area can be generally removed before the array substrate being installed into the display device. Thus, after the cut-off area 108 is cut off from the array substrate, all the wires will be cut off, so that the voltage input ports and the scanning lines can be electrically insulated, and hence the signal interference of the voltage input ports to the scanning lines can be avoided. Moreover, circuit nodes that connect the wires to the scanning lines may be disposed in the cut-off area 108. Thus, after the cut-off area 108 is cut off from the array substrate, the electrical insulation between different scanning lines can still be maintained, and hence normal display is not affected. It should be understood that the array substrate provided with the cut-off area 108 may be a product which has been finished in the manufacturing process and is sent to the next manufacturing process, and may also be a structure which is in an intermediate state in the manufacturing process. The actual structure of the array substrate provided by the embodiments of the present disclosure shall be understood by those skilled in the art according to specific scenarios.

Figure 2:
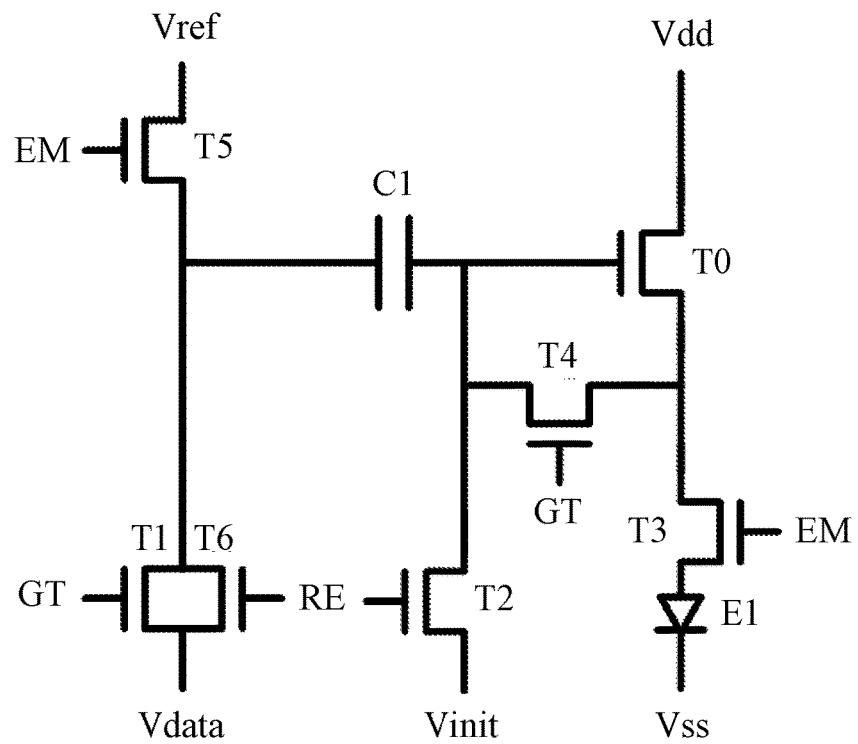
FIG. 2 is a circuit diagram of a pixel circuit provided by one embodiment of the present disclosure.

In one specific example of the pixel circuit 102, FIG. 2 is a circuit diagram of a pixel circuit in one embodiment of the present disclosure. As illustrated in FIG. 2, in the pixel circuit, an OLED E1 is disposed between a first bias electrode Vdd and a second bias electrode Vss to form a drive current path.

A source electrode and a drain electrode of a driving transistor T0 are disposed in the drive current path and may be configured to control the drive current in the drive current path under the control of a voltage signal applied to a gate electrode of the driving transistor T0.

A gate electrode of a first transistor T1 is connected with a first scanning line GT. One of a source electrode and a drain electrode of the first transistor T1 is connected with the gate electrode of the driving transistor T0 through a capacitor C1, and the other of the source electrode and the drain electrode of the first transistor T1 is connected with a data line. The first transistor T1 with this circuit connection relationship may be configured to: couple the data voltage Vdata on the data line to the gate electrode of the driving transistor T0 under the control of the voltage applied on the first scanning line GT, so that the drive current can be controlled by the data voltage Vdata.

A gate electrode of a second transistor T2 is connected with a second scanning line RE. One of a source electrode and a drain electrode of the second transistor T2 is connected with the gate electrode of the driving transistor T0, and the other of the source electrode and the drain electrode of the second transistor T2 is connected with an initial voltage line. The second transistor T2 with this circuit connection relationship may be configured to: set the voltage applied to the gate electrode of the driving transistor T0 to be an initial voltage Vinit applied on the initial voltage line under the control of the voltage on the second scanning line RE.

A gate electrode of a third transistor T3 is connected with a third scanning line EM. A source electrode and a drain electrode of the third transistor T3 are disposed in the drive current path. The third transistor T3 with this circuit connection relationship may be configured to achieve the turning-on or turning-off switching of the drive current path under the control of the voltage on the third scanning line EM.

A gate electrode of a fourth transistor T4 is connected with the first scanning line GT. One of a source electrode and a drain electrode of the fourth transistor T4 is connected with the gate electrode of the driving transistor T0, and the other of the source electrode and the drain electrode of the fourth transistor T4 is connected with the source electrode or the drain electrode of the driving transistor T0. The fourth transistor T4 with this circuit connection relationship may be configured to: set the driving transistor T0 to be in the diode connection state under the control of the voltage on the first scanning line GT, so that a threshold voltage of the driving transistor T0 can be obtained.

A gate electrode of a fifth transistor T5 is connected with the third scanning line EM. One of a source electrode and a drain electrode of the fifth transistor T5 is applied with a reference voltage Vref, and the other is connected with a first end of the capacitor C1 (another end of the capacitor C1 that is connected with the driving transistor T0 is referred to as a second end of the capacitor C1). The fifth transistor T5 with this circuit connection relationship may be configured to set the voltage of the first end of the capacitor C1 to be the reference voltage Vref under the control of the voltage on the third scanning line EM.

A gate electrode of a sixth transistor T6 is connected with the second scanning line RE. One of a source electrode and a drain electrode of the sixth transistor T6 is connected with the first end of the capacitor C1, and the other is connected with the data line. The sixth transistor T6 with this circuit connection relationship may be configured to set the voltage of the first end of the capacitor C1 to be the voltage Vdata on the data line under the control of the voltage on the second scanning line RE.

It should be understood that operations can be performed in the pixel circuit under appropriate signal timing sequence: firstly, the voltages at both ends of the capacitor C1 is initialized; secondly, the threshold voltage of the driving transistor T0 is written into the second end of the capacitor C1; thirdly, the data voltage Vdata on the data line is coupled to the gate electrode of the driving transistor T0; and finally, the third transistor T3 is switched on, so that the OLED E1 can emit light under the drive current determined by the data voltage Vdata.

It can be seen that each pixel circuit may be simultaneously connected with the first scanning line GT, the second scanning line RE and the third scanning line EM. Thus, as illustrated in FIG. 1, each pixel circuit 102 may be connected to the three voltage input ports 110 through a first wire, a second wire and a third wire respectively, and electrical aging of each pixel circuit can be directly performed under the action of the aging voltages inputted into the three voltage input ports 110. As shown in FIG. 1, each scanning-line group 116 includes a respective first scanning line GT, a respective second scanning line RE and a respective third scanning line EM; the wire group 114 includes the first wire, the second wire and the third wire; and the voltage input interface 106 includes the first voltage input port, the second voltage input port and the third voltage input port.

However, it should be understood that due to the arrangement of an OLED E1 in each pixel circuit, the pixel circuits in the embodiments of the present disclosure are only an example in the AMOLED display mode; the pixel circuits may also be pixel circuits in other display modes such as liquid crystal display (LCD); and pixel circuits with other structures may also be obtained with reference to structures of pixel circuits in a conventional AMOLED. No limitation is placed in the present disclosure.

For instance, a pixel circuit without threshold compensation functionality may be formed by a driving transistor T0 with a source electrode and a drain electrode being disposed in the drive current path and a first transistor T1 with a gate electrode being connected with the scanning drive circuit 104 through a first scanning line GT, where one of the source electrode and the drain electrode of the first transistor T1 is connected with the gate electrode of the driving transistor T0, and the other of the source electrode and the drain electrode of the first transistor T1 is connected with a data line Vdata. In all the pixel circuits with this structure, the first wire in the wire group may be connected with all the first scanning lines GT; and the first voltage input port of the voltage input interface is connected with the first wire, so that the aging voltage can be applied to all the gate electrodes of the first transistors T1 in the pixel circuits through the first voltage input port. Of course, beside the driving transistor T0 and the first transistor T1, each pixel circuit may further include other components such as capacitors.

For instance, each pixel circuit may further include a second transistor T2 with its gate electrode connected with the scanning drive circuit 104 through a second scanning line RE (one of a source electrode and a drain electrode in the second transistor T2 is connected with the gate electrode of the driving transistor T0, and the other of the source electrode and the drain electrode in the second transistor T2 is connected with an initial voltage line Vinit). In all the pixel circuits with this structure, the second wire in the wire group is connected with all the second scanning lines RE respectively, and the second voltage input port in the voltage input interface is connected with the second wire. Thus, the aging voltage can be applied to the gate electrodes of the second transistors T2 in all the pixel circuits through the second voltage input port. Of course, beside the second transistor T2, each pixel circuit may further include other components such as capacitors.

For instance, each pixel circuit may further include a third transistor T3 with a source electrode and a drain electrode being disposed in the drive current path, where a gate electrode of the third transistor T3 is connected with the scanning drive circuit 104 through a third scanning line EM. In all the pixel circuits with this structure, the third wire in the wire group may be connected with all the third scanning lines EM respectively; the third voltage input port in the voltage input interface is connected with the third wire; and the aging voltage is applied to the gate electrodes of the third transistors T3 in all the pixel circuits through the third voltage input port. Of course, beside the third transistor T3, the pixel circuit may further include other components such as capacitors.

The embodiments of the present disclosure further provide an electrical aging method of pixel circuits, where the pixel circuits are disposed in respective pixel regions of a display area of an array substrate, and the array substrate can be any foregoing array substrate. For instance, the electrical aging method of the pixel circuits comprises:

applying aging voltage signals to voltage input ports of a voltage input interface respectively, so that at least part of transistors in the pixel circuits can be subjected to electrical aging under the action of the aging voltage signals received by gate electrodes of the corresponding transistors.

Description will be given below by taking the pixel circuit as shown in FIG. 2 as a specific example.

In order to achieve simultaneous electrical aging of the first transistor T1, the second transistor T2 and the sixth transistor T6 in the pixel circuit, a 15V voltage may be applied to the first scanning line GT through the first voltage input port; another 15V voltage may be applied to the second scanning line RE through the second voltage input port; and a −18V voltage may be applied to the third scanning line EM through the third voltage input port. Meanwhile, the initial voltage Vinit on the initial voltage line is set to be −15V; the reference voltage Vref is set to be −15V; the data voltage Vdata on the data line is set to be 0V; and the voltage on the first bias electrode Vdd and the voltage on the second bias electrode Vss are respectively set to be 0V and 0V. Then, the electrical aging of the first transistor T1, the second transistor T2 and the sixth transistor T6 can be completed under the action of the aging voltage signals with an aging time of 10 s.

In order to achieve simultaneous electrical aging of the third transistor T3 and the fifth transistor T5 in the pixel circuit, a 0V voltage may be applied to the first scanning line GT through the first voltage input port; a 0V voltage may be applied to the second scanning line RE through the second voltage input port; and a 15V voltage may be applied to the third scanning line EM through the third voltage input port. Meanwhile, the initial voltage Vinit on the initial voltage line is set to be 0V; the reference voltage Vref is set to be −15V; the data voltage Vdata on the data line is set to be 0V; and the voltage on the first bias electrode Vdd and the voltage on the voltage on the second bias electrode Vss are respectively set to be 0V and −15V. Thus, the electrical aging of the third transistor T3 and the fifth transistor T5 can be completed with an aging time of 10 s in this state.

In order to achieve the electrical aging of the fourth transistor T4, a 15V voltage may be applied to the first scanning line GT through the first voltage input port; a −18V voltage may be applied to the second scanning line RE through the second voltage input port; and a 7V voltage may be applied to the third scanning line EM through the third voltage input port. Meanwhile, the initial voltage Vinit on the initial voltage line is set to be −15V; the reference voltage Vref is set to be 0V; the data voltage Vdata on the data line is set to be 0V; and the voltage on the first bias electrode Vdd and the voltage on the second bias electrode Vss are respectively set to be 0V and 0V. Thus, the electrical aging of the fourth transistor T4 can be completed with an aging time of 10 s in this state.

In order to achieve the electrical aging of the driving transistor T0, a 18V voltage may be applied to the first scanning line GT through the first voltage input port; a −7V voltage may be applied to the second scanning line RE through the second voltage input port; and a −18V voltage may be applied to the third scanning line EM through the third voltage input port. Meanwhile, the initial voltage Vinit on the initial voltage line is set to be 15V; the reference voltage Vref is set to be 0V; the data voltage Vdata on the data line is set to be 0V; and the voltage on the first bias electrode Vdd and the voltage on the second bias electrode Vss are respectively set to be 0V and −15V. Thus, the electrical aging of the driving transistor T0 can be completed with an aging time of 10 s in this state.

Of course, the above approach is only one specific example of the electrical aging method provided by the embodiments of the present disclosure. Corresponding electrical aging methods can be obtained with reference to the embodiments of the present disclosure when the pixel circuits include other structures.

It can be seen that in the embodiments of the present disclosure, due to the arrangement of the wire group (including one or more wires), the voltage input interface (including one or more voltage input ports) and the insulating layer, voltage signals may be directly applied to the plurality of scanning lines through the wires and the voltage input ports; and meanwhile, the wires running above the configuration area of the scanning drive circuit will not damage the scanning drive circuit with the insulation from the insulating layer. In another aspect, as the aging voltages are directly applied to the plurality of scanning lines, the circuit defects in the scanning drive circuit will not affect the electrical aging of the pixel circuits. The embodiments of the present disclosure can solve the problem that a conventional electrical aging method can damage the GOA circuits. Therefore, the embodiments of the present disclosure can reduce the yield loss caused by damage of the GOA circuits during a conventional electrical aging, and hence can improve the production efficiency and reduce the cost.

The embodiments of the present disclosure further provide a display device comprising any foregoing array substrate. It should be noted that the display device provided by the embodiments may be: any product or component with a display function such as a display panel, an electronic paper, a mobile phone, a tablet PC, a TV, a notebook computer, a digital picture frame and a navigator. As the display device provided by the embodiments of the present disclosure comprises any foregoing array substrate, the embodiments of the present disclosure can solve the problem that a conventional electrical aging method may damage the GOA circuits, can reduce the yield loss caused by damage of the GOA circuits during a conventional electrical aging, and hence can improve the production efficiency and reduce the cost.

In addition, the embodiments of the present disclosure further provide a method for manufacturing a display device comprising any foregoing array substrate. For instance, the array substrate includes a cut-off area disposed at the edge, and a respective wiring path of each wire runs through the cut-off area. For instance, a method for manufacturing the display device comprises:

removing the cut-off area to cut off each wire after the electrical aging of the pixel circuits on the array substrate.

For instance, the cut-off area 108 can be removed from the array substrate by cutting the array substrate along a dashed line 150 shown in FIG. 1. It should be understood that the cut-off area 108 is a special area disposed at the edge of the array substrate and may be configured to accommodate structures which are needed in some manufacturing, testing or repair processes but are not needed or adverse during display, and so, the cut-off area can be generally removed before the array substrate being installed into the display device. Thus, after the cut-off area 108 is cut off from the array substrate, all the wires will be cut off, so that the voltage input ports and the scanning lines can be electrically insulated, and hence signal interference of the voltage input ports to the scanning lines can be avoided.

Moreover, all the circuit nodes for connecting the scanning lines with the wires may be disposed in the cut-off area 108. Thus, as all the circuit nodes of each wire for connecting the scanning lines are disposed in the cut-off area 108, electrical insulation between different scanning lines can still be maintained after the cut-off area 108 is cut off from the array substrate, and hence normal display cannot be affected.

It should be understood that the array substrate provided with the cut-off area 108 may be a product which has been finished in the manufacturing process and is sent to a next manufacturing process, and may also be a structure which is in an intermediate state in the manufacturing process. The actual structure of the array substrate shall be understood by those skilled in the art according to specific scenarios.

In addition, in the array substrate obtained after the cut-off area is cut off, because the wires can easily make contact with objects in the exterior environment and generate static electricity, the array substrate in which the wires are left tends to have electrostatic defects. Thus, the method for manufacturing the display device may comprise the following step: separating the wire group by laser cutting. For instance, the wires formed on the insulating layer as well as part of the insulating layer may be entirely severed by laser cutting, or at least areas provided with the wires can be separated by laser cutting. Hence, possibility of causing electrostatic defects can be reduced.

It should be noted that, in the drawings, the size of a layer or an area may be exaggerated for clarity of the drawings. Besides, it is understandable that if an element or a layer is said to be "under" another element or layer, it can be directly under the other element or an intermediate layer may exist therebetween. Besides, it is understandable that if a layer or an element is said to be "between" two layers or "between" two elements, it can be the only one layer or element between the two layers or two elements, or one or more intermediate layer or element can exist. Similar reference marks in the full text refer to the similar elements.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

The foregoing are merely specific embodiments of the disclosure, but not limitative to the protection scope of the disclosure. One skilled in the art could devise variations or replacements that within the scope and the spirit of the present disclosure, those variations or replacements shall belong to the protection scope of the disclosure. Thus, the protection scope of the disclosure shall be defined by the accompanying claims.

The present disclosure claims the benefits of Chinese patent application No. 201610060551.6, which was filed on Jan. 28, 2016 and is incorporated herein in its entirety by reference as part of this application.

What is claimed is:

1. An array substrate, comprising:
    pixel circuits in a display area;
    a scanning drive circuit on at least one side of the pixel circuits in a periphery area surrounding the display area;
    a plurality of scanning-line groups for connecting the pixel circuits to the scanning drive circuit;
    a wire group, comprising a first wire sub-group and a second wire sub-group, wherein the first wire sub-group is opposite to the scanning drive circuit, the first wire sub-group comprises a first terminal and a second terminal; and
    an insulating layer disposed between the first wire sub-group and the scanning drive circuit;
    wherein the first terminal is directly connected to the scanning drive circuit and the pixel circuits, and
    the second terminal is disconnected from the second wire sub-group which has been cut off and is originally coupled to the first wire sub-group.

2. The array substrate according to claim 1, wherein each of the pixel circuits includes an organic light-emitting diode (OLED) disposed between a first bias electrode and a second bias electrode to form a drive current path.

3. A display device, comprising the array substrate according to claim 1.

4. A method for manufacturing a display device, with the display device including the array substrate according to claim 1, the array substrate including a cut-off area disposed at an edge of the array substrate, and a wiring path of each wire in the second wire sub-group running through the cut-off area, the method comprising:
   removing the cut-off area to cut off each wire in the second wire sub-group after electrical aging of the pixel circuits on the array substrate.

5. The method for manufacturing the display device according to claim 4, further comprising:
   cutting off each wire in the second wire sub-group with laser.

6. An array substrate, comprising:
   pixel circuits disposed in a display area;
   a scanning drive circuit disposed on at least one side of pixel circuits in a periphery area surrounding the display area;
   a plurality of scanning-line groups for connecting the pixel circuits to the scanning drive circuit;
   a voltage input interface disposed outside the display area; and
   a wire group, comprising a first wire sub-group and a second wire sub-group, wherein the first wire sub-group is opposite to the scanning drive circuit, the second wire sub-group is in a cut-off area, the cut-off area is at a side of the periphery area far away from the display area;
   wherein an insulating layer is disposed between the first wire sub-group and the scanning drive circuit,
   wherein the first wire sub-group is directly connected to the scanning drive circuit and the pixel circuits, and
   wherein the second wire sub-group is connected to the first wire sub-group and a voltage input interface in the periphery area.

7. The array substrate according to claim 6, wherein the array substrate comprises the cut-off area disposed at an edge of the array substrate, and a wiring path of each wire in the second wire sub-group runs through the cut-off area.

8. The array substrate according to claim 7, wherein circuit nodes of each wire in the second wire sub-group that connect corresponding scanning lines to the wire are disposed in the cut-off area.

9. The array substrate according to claim 6, wherein each of the pixel circuits includes an organic light-emitting diode (OLED) disposed between a first bias electrode and a second bias electrode to form a drive current path.

10. The array substrate according to claim 9, wherein:
   each of the pixel circuits further includes a driving transistor and a first transistor, and each scanning-line group includes a first scanning line;
   a source electrode and a drain electrode of the driving transistor are disposed in the drive current path;
   one of a source electrode and a drain electrode of the first transistor is connected with a gate electrode of the driving transistor, and the other of the source electrode and the drain electrode of the first transistor is connected with a data line; and
   a gate electrode of the first transistor is connected with the scanning drive circuit through the first scanning line, a first wire in the first wire sub-group is connected with the first scanning line, and a first voltage input port of the voltage input interface is connected with the first wire.

11. The array substrate according to claim 10, wherein:
   each of the pixel circuits further includes a second transistor, each scanning-line group further includes a second scanning line;
   one of a source electrode and a drain electrode of the second transistor is connected with the gate electrode of the driving transistor, and the other of the source electrode and the drain electrode of the second transistor is connected with an initial voltage line;
   a gate electrode of the second transistor is connected with the scanning drive circuit through the second scanning line;
   a second wire in the first wire sub-group is connected with the second scanning line; and
   a second voltage input port of the voltage input interface is connected with the second wire.

12. The array substrate according to claim 9, wherein:
   each of the pixel circuits further includes a third transistor with a source electrode and a drain electrode being disposed in the drive current path, and each scanning-line group includes a third scanning line;
   a gate electrode of the third transistor is connected with the scanning drive circuit through the third scanning line;
   a third wire in the first wire sub-group is connected with the third scanning line; and
   a third voltage input port of the voltage input interface is connected with the third wire.

13. A display device, comprising the array substrate according to claim 6.

14. An electrical aging method of pixel circuits, with the pixel circuits being disposed in pixel regions of a display area of the array substrate according to claim 6, comprising:
   applying aging voltage signals to voltage input ports of the voltage input interface respectively, so that at least part of transistors in the pixel circuits are subjected to electrical aging in response to application of the aging voltage signals received by gate electrodes of the transistors;
   wherein the aging voltage signals are the plurality of scanning drive signals.

15. A method for manufacturing a display device, with the display device including the array substrate according to claim 6, the array substrate including the cut-off area disposed at the edge of the array substrate, and a wiring path of each wire in the second wire sub-group running through the cut-off area, the method comprising:
   removing the cut-off area to cut off each wire in the second wire sub-group after electrical aging of the pixel circuits on the array substrate.

16. The method for manufacturing the display device according to claim 15, further comprising:
   cutting off each wire in the second wire sub-group with laser.

* * * * *